(12) United States Patent
Sayyah et al.

(10) Patent No.: US 9,733,544 B2
(45) Date of Patent: Aug. 15, 2017

(54) TUNABLE OPTICAL METAMATERIAL (71) Applicant: HRL LABRORATORIES, LLC, Malibu, CA (US)

(72) Inventors: Keyvan Sayyah, Santa Monica, CA (US); James H. Schaffner, Chatsworth, CA (US); Pamela R. Patterson, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/532,774

(22) Filed: Nov. 4, 2014

(65) Prior Publication Data

US 2015/0062691 A1 Mar. 5, 2015

Related U.S. Application Data

(62) Division of application No. 13/754,140, filed on Jan. 30, 2013, now Pat. No. 8,908,251.

(51) Int. Cl.
*G02F 1/03* (2006.01)
*H01P 7/00* (2006.01)
(Continued)

(52) U.S. Cl.
CPC .............. *G02F 1/29* (2013.01); *G02B 1/002* (2013.01); *G02F 1/0018* (2013.01); *H01L 21/84* (2013.01);
(Continued)

(58) Field of Classification Search
CPC .......... G02F 1/0316; G02F 1/29; H01P 7/088; H01L 31/02161
(Continued)

(56) References Cited

U.S. PATENT DOCUMENTS 4,394,060 A 7/1983 Verber
5,835,199 A 11/1998 Phillips
(Continued)

OTHER PUBLICATIONS

From U.S. Appl. No. 13/754,140 (now U.S. Pat. No. 8,908,251), Notice of Allowance mailed on Aug. 4, 2014).

(Continued)

*Primary Examiner* — William Choi
(74) *Attorney, Agent, or Firm* — Ladas & Parry (57) ABSTRACT

A tunable metamaterial has a two dimensional array of resonant annular ring elements; and a plurality of voltage controllable electrical tuning elements disposed in or adjacent openings in each of said ring elements, each of said voltage controllable electrical tuning element ohmically contacting portions of only one of said ring elements. The voltage controllable electrical tuning elements may comprise highly doped semiconductor tunnel diodes, or the charge accumulation layer at the semiconductor/insulator interface of a metal-insulator-semiconductor structure, or nanoelectromechanical (NEMs) capacitors. The tunable metamaterial may be used, for example, in an optical beam steering device using the aforementioned tunable optical metamaterial in which a free-space optical beam is coupled into a receiving portion of a plane of the optical metamaterial and is steered out of a transmitter portion of the plane of the optical metamaterial in controllable azimuthal and elevational directions. The tunable metamaterial additionally has other applications.

16 Claims, 10 Drawing Sheets

(51) Int. Cl.
- *G02F 1/29* (2006.01)
- *H01L 31/0216* (2014.01)
- *H01Q 15/00* (2006.01)
- *G02B 1/00* (2006.01)
- *G02F 1/00* (2006.01)
- *H01L 21/84* (2006.01)
- *H01L 29/66* (2006.01)
- *H01P 7/08* (2006.01)
- *B82Y 20/00* (2011.01)
- *B82Y 40/00* (2011.01)
- *G02F 1/19* (2006.01)
- *G02F 1/21* (2006.01)
- *G02F 1/225* (2006.01)
- *G02F 1/015* (2006.01)

(52) U.S. Cl.
CPC .. *H01L 29/66151* (2013.01); *H01L 31/02161* (2013.01); *H01P 7/082* (2013.01); *H01Q 15/002* (2013.01); *H01Q 15/0086* (2013.01); *B82Y 20/00* (2013.01); *B82Y 40/00* (2013.01); *G02F 1/0316* (2013.01); *G02F 1/19* (2013.01); *G02F 1/218* (2013.01); *G02F 1/2257* (2013.01); *G02F 2001/0151* (2013.01); *G02F 2001/212* (2013.01); *G02F 2001/291* (2013.01); *G02F 2202/30* (2013.01); *G02F 2203/12* (2013.01); *G02F 2203/13* (2013.01); *G02F 2203/15* (2013.01); *G02F 2203/24* (2013.01); *H01P 7/088* (2013.01)

(58) Field of Classification Search
USPC ....... 359/219, 235, 237, 241, 244, 321, 245, 359/254; 333/219, 235; 455/63.4
See application file for complete search history.

(56) References Cited

U.S. PATENT DOCUMENTS

| | | |
|---|---|---|
| 5,852,492 A | 12/1998 | Nimblett |
| 8,908,251 B2 | 12/2014 | Sayyah |
| 2009/0096545 A1* | 4/2009 | O'Hara ............ H01P 7/08 332/129 |
| 2009/0262766 A1 | 10/2009 | Chen |
| 2010/0301971 A1* | 12/2010 | Yonak ........... H01P 1/20381 333/219.1 |
| 2014/0080729 A1 | 3/2014 | Grego |
| 2014/0211298 A1 | 7/2014 | Sayyah |

OTHER PUBLICATIONS

MacManamon, P.F. et al., "Optical Phased Array technology", Proceedings of IEEE, vol. 84, No. 2, 1996, p. 268-298.

Vasey, F. et al., "Spatial optical beam steering with an ALGaAs integrated phased array", Applied Optics, vol. 32 (1993) p. 3220-3232.

Hand, Thomas Henry, "Design and Applications of Frequency Tunable and Reconfigurable Metamaterials", Department of Electrical and Computer Engineering Duke University, 2009 (208 pages).

U.S. Appl. No. 14/795,860, filed Jul. 9, 2015, Sayyah.

U.S. Appl. No. 14/795,860 (unpublished; non publication request filed), Office Action dated Dec. 13, 2016.

U.S. Appl. No. 14/795,860 (unpublished; non publication request filed), Notice of Allowance dated Sep. 6, 2016.

Adany et al., "Chirped Lidar Using Simplified Homodyne Detection," Journal of Lifewave Technology, vol. 27, No. 16, Aug. 15, 2009, pp. 3351-3357.

McKeag et al., "New Developments in HgCdTe APDs and Ladar Receivers," Proc. SPIE 8012, Infrared Technology Applications XXXVII, 801230, Jun. 20, 2011, pp. 801230-1-801230-14.

Yu, Jirong, et al., "High Energy Double-pulsed Ho:Tm:YLF Laser Amplifier", NASA Langley Research Center, Laser System Branch, MS 474, Hampton, VA 23681, 2002 (4 pages).

* cited by examiner

Fig 3. Junction capacitance and current of a p$^+$n$^+$ tunnel diode as a function of its bias voltage.

TUNABLE OPTICAL METAMATERIAL

CROSS-REFERENCE TO RELATED APPLICATIONS

This application is a division of U.S. patent application Ser. No. 13/754,140, filed on Jan. 30, 2013.

TECHNICAL FIELD

This invention is about a tunable optical metamaterial whose effective refractive index can be spatially programmed, in two dimensions, resulting in an artificial material with a tunable index profile. The disclosed metamaterial can be used in a number of applications, including optical beam steering, optical modulation, and optical beam shaping.

BACKGROUND

Optical beam steerers are known in the prior art. A liquid crystal-based optical phased array (LC-OPA) may be the current the state-of-the-art in optical beam steering devices. See P. F. McManamon et. al., *Proceedings of IEEE*, Vol. 40, No. 2 (1996) p. 268. It consists of a liquid crystal (LC) cell with one-dimensional patterned transparent conductor strips in which each strip defines an element of the linear array. For beam steering in the two azimuthal and elevational directions, two such LC cells are arranged in orthogonal orientations.

LC-OPA is a fairly mature technology with very low power consumption due to the capacitive nature of the liquid crystal. However, the disadvantage of the LC-OPA is its slow steering speed (10's of ms range) which is due to the slow response time of the LC-based phase shifting elements. Another disadvantage of liquid crystals is their limited temperature operation range. At low temperatures ($<0°$ C.) the LC response time significantly degrades due to its increased viscosity, while at higher temperatures ($>50°$ C.) it becomes isotropic and hence loses functionality. Consequently, for practical purposes, the operating temperature of the LC-OPA should be externally controlled, which further adds to its complexity of having two separate LC cells assembled in tandem for 2-D beam steering.

The other problem with LC-OPA is the presence of grating lobes in the steered beam, which not only severely reduces the optical efficiency of the phased array but also requires complex signal detection circuitry. In order to eliminate grating lobes in phased arrays, the spacing between array elements must be less than the wavelength of the steered optical beam. In LC-OPAs, the array elements (strip width) are in the range of 5 to 10 µm, and hence larger than the wavelength of the optical beam in the visible and near-IR region. Reducing the strip width below 5 µm results in a significant field fringing effect, and hence decreased electro-optic efficiency, since the thickness of the LC cell is about 4 µm.

Another prior art beam steering approach is based on the use of integrated AlGaAs waveguide arrays on a GaAs substrate in which each array element is a tunable phase shifter. See F. Vasey, et. al., *Applied Optics*, Vol. 32 (1993) p. 3220. The phase tuning is achieved via the linear electro-optic effect in the material by forming a heterojunction barrier with a low resistivity transparent conductor (indium-tin-oxide) cladding layer.

The main problem with integrated AlGaAs waveguide array approach is the rather limited phase delay achievable with these tunable waveguides due to a weak electro-optic effect. Waveguide lengths of more than 3 mm are required in order to obtain a $2\pi$ phase delay at 850 nm. Also, similar to the LC-OPA described above, this phased array will also have grating lobes, since the minimum width of the waveguides (about 2.5 µm) is a factor of two to three larger than the operating wavelength.

In contrast, a phased array beam steerer based on the disclosed tunable metamaterial disclosed hereon does not suffer from grating lobes since the spacing of the waveguide array can be as small as the unit cell dimension, which is about ¼ to ⅓ of the wavelength. Furthermore, since tunable phase shifts of $0$-$2\pi$ can be achieved between adjacent array elements with array spacing of less than half the wavelength, the steering angle of this novel beam steerer can approach $0$-$90°$ in both azimuthal and elevational directions, which is significantly larger than those achievable with the LC-OPA and the AlGaAs waveguide devices mentioned above.

BRIEF DESCRIPTION OF THE INVENTION

A tunable optical metamaterial includes an array of resonant metallic elements with one or more voltage controllable electrical tuning elements within each resonant metallic element. The voltage controllable electrical tuning elements may comprise highly doped semiconductor tunnel diodes, or the charge accumulation layer at the semiconductor/insulator interface of a metal-insulator-semiconductor structure, or nanoelectromechanical (NEMs) capacitors, the optical metamaterial including a two dimensional array of resonant annular ring elements, each of the resonant annular ring elements having a plurality of openings therein; and a plurality of voltage controllable electrical tuning elements disposed in or adjacent the openings in each of the resonant annular ring elements, each of the voltage controllable electrical tuning elements ohmically contacting spaced apart portions of only one of said ring elements.

In another aspect the present invention relates to an optical beam steering device comprising a two dimensional array of resonant annular ring elements, each resonant annular ring element having a plurality of openings therein; and a plurality of voltage controllable electrical tuning elements disposed in or adjacent the openings in each of said ring elements, each of said voltage controllable electrical tuning element ohmically contacting portions of only one of said ring elements.

In yet another aspect the present invention provides a tunable optical metamaterial comprising a two dimensional array of resonant metallic annular elements with a plurality of voltage controllable electrical tuning element disposed within openings in annular walls of each element, each resonant metallic element in said array being resonant at optical frequencies, and voltage controllable electrical tuning elements comprising highly doped semiconductor tunnel diodes, or devices utilizing channel conductance of the charge accumulation layer at a semiconductor/insulator interface of a metal-insulator-semiconductor structure, or nanoelectromechanical capacitors.

In still yet another aspect the present invention provides a tunable optical metamaterial including an array of resonant metallic elements which are resonant to electromagnetic radiation having a wavelength longer than 0.4 microns and shorter than 0.3 mm, each of the resonant metallic elements in said array comprising a split ring having a plurality of openings in the split ring and having at least one voltage controllable electrical tuning elements disposed in each opening in the split ring.

In another aspect the present invention provides a tunable optical metamaterial including an array of resonant metallic elements which are resonant to electromagnetic radiation, each of the resonant metallic elements in said array assuming a geometric shape having a exterior wall with a plurality of openings in said exterior wall and having one or more voltage controllable electrical tuning elements disposed within the openings in said exterior wall.

DETAILED DESCRIPTION

Figure 1A:
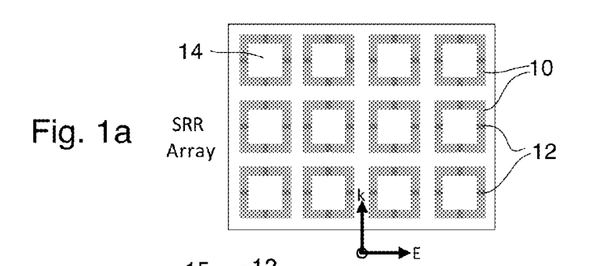
FIGS. 1a-1d depict a two dimensional (2D) array of metallic resonant structures with three different possible embodiments of the electrical tuning elements used therein.

The tunable optical metamaterial is composed of a two-dimensional array of sub-wavelength-scale resonant metallic structures 10 with integrated nano-scale voltage-controllable electrical tuning elements 12 disposed in the sides thereof in an exemplary embodiment as shown in FIG. 1a. The metallic unit-cell structures 10 are preferably disposed on a dielectric substrate 20 for support and are designed to have electrical resonances preferably at optical frequencies (i.e. electromagnetic radiation having a wavelength longer than 0.4 microns (blue/violet end of the visible spectrum) and shorter than 0.3 mm (1 terahertz frequency)), which can be achieved by reducing their dimensions to sub-micron scales. If the metallic unit-cell structures 10 are to be used at lower optical frequencies (such infrared, terahertz), then their sizes may be increased accordingly.

There are a number of metallic structures 10 that have electrical resonances at optical frequencies such as metallic split-ring resonators (SRR) and metallic patches. FIG. 1a shows a two dimensional (2-D) array of metallic SRRs 10 wherein each metallic SSR is formed by a ring of metal shaped in a geometric configuration with openings 15 which occur in the side walls of each SRR 10. In the embodiment of FIG. 1a, the SSR assumes a square shape, having a square shaped exterior and a square shaped interior opening 14. Since the SSR in the embodiment of FIG. 1a is square shaped, it has four side walls and each side wall has an opening 15 preferably located in the mid point of each side wall. The openings 15 in the four side walls of the SRRs 10 each receive one of the electrical tuning elements 12 which makes ohmic contact with the otherwise exposed ends of the metallic side wall at the openings 15.

Figure 1B:
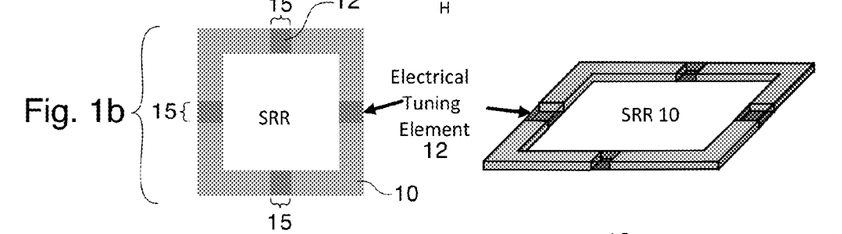

FIG. 1b shows a single SRR 10 in a plan view (on the left hand side of the figure, where three of the four openings are called out by a reference numeral 15) and in a perspective view (on the right hand side of that figure). In this embodiment, each SRR 10 has a square shape with four equal-length side walls, with each side wall having the aforementioned opening 15 therein for receiving the electrical tuning elements 12 disposed therein. The electrical tuning elements 12 make electrical contact with the immediately abutting metal surfaces of the openings in the side walls of each SRR 10. There is preferably a single opening 15 in each of the four sides of the square-shaped SRR depicted in FIGS. 1a and 1b.

The SSR 10 do not have to been shaped as a square as other geometric shapes can be useful in certain applications. For example, a rectangular shape may be used instead. In such an embodiment, a two dimensional (2-D) array of metallic rectangularly shaped SRRs would have electrical resonances at two different dispersion characteristics in two orthogonal directions (assuming all of the rectangularly shaped SRRs had the same identical shape, size and relative orientation to one another). Other geometric shapes for the SRRs can be alternatively used (see, for example, FIG. 1e where the side walls are basically of a circular configuration) and the shapes, their sizes and orientation relative to each other can be mixed if desired. The two dimensional (2-D) array of metallic rectangularly shaped SRRs should be supported relative to each other and therefore are preferably disposed directly on the dielectric surface 20 as shown in FIG. 1a. The dielectric surface 20 is omitted from FIGS. 1b-1e for ease of illustration. If the support surface 20 is lossy at the frequencies of interest, then a suitable non-lossy insulating layer (see the $SiO_2$ layer 40 of FIG. 9 for example) may be used between the substrate 20 and the array of SRRs 10. The SRRs may be embedded in a dielectric material if desired.

Only twelve SRRs 10 are depicted in the array of FIG. 1a, but it is to be understood that the size of the array would typically be very large in terms of the numbers of SSRs 10 deployed in the array and only twelve SRRs 10 are depicted in the array of FIG. 1a simply for ease of illustration.

Figure 1C:
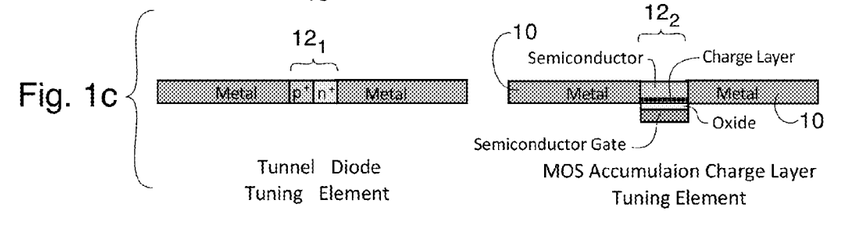
Figure 1D:
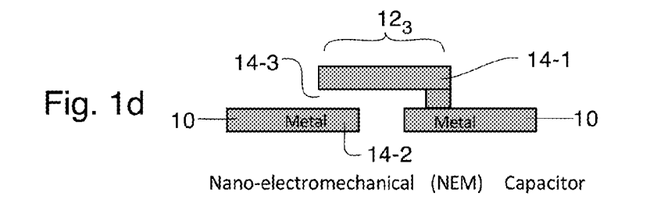
Figure 1E:
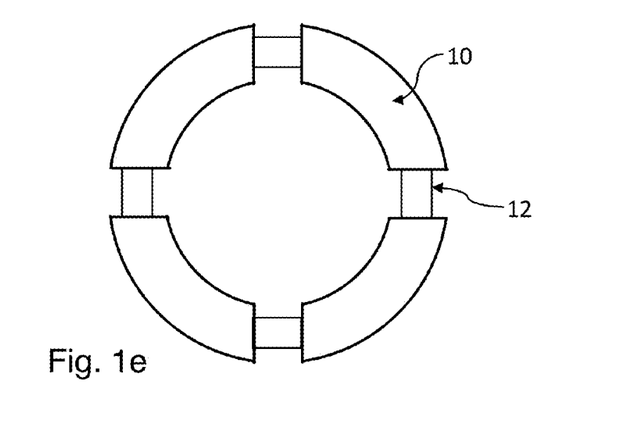
FIG. 1e depicts another embodiment of metallic resonant structure of FIG. 1b.

Three different possible embodiments of the electrical tuning elements 12 are depicted in FIGS. 1c and 1d which are implemented by: (1) voltage dependent capacitance of $p^+n^+$ tunnel diodes $12_1$ (see the left hand side of FIG. 1c), (2) voltage dependent conductance of MOS accumulation layers 12₂ (see the right hand side of FIG. 1c), and (3) voltage dependent capacitance of nanoelectromechanical (NEMs) capacitors $12_3$ (see FIG. 1d). SRRs 10 can have resonance frequencies up to 500 THz (600 nm optical wavelength) by simply reducing their dimensions to about 60 nm on a side. This is due to the fact that these structures can be electrically represented as a series LC circuit whose resonance frequency is inversely proportional to $(LC)^{1/2}$. Reducing the physical dimension of the SRR 10 reduces its electrical inductance, hence increasing the resonance frequency.

By arranging these resonant SRRs 10 in a two dimensional (2D) planar array, for example, a new type of metamaterial with unique dispersion characteristics can be obtained. This metamaterial is different than conventional dielectric-based photonic crystals since its unit cell size, as measured along a side of the SRR, is smaller than $\lambda/2$, as shown below, where $\lambda$ is the free-space wavelength of light that is coupled to and/or propagates along the SRR array surface. The dispersion ($\omega$-k) characteristic of this metamaterial is highly nonlinear with slow light group velocity saturation. Furthermore, the dispersion characteristics can be tailored by either changing the geometrical or electrical parameters of the resonant unit cell structure. For example, by varying the capacitance in the gap regions of the SRR 10 with voltage controllable elements 12 (see FIGS. 1a-1e), the dispersion characteristics of the 2D metamaterial can be tuned and hence modulate its effective index.

Figure 2A:
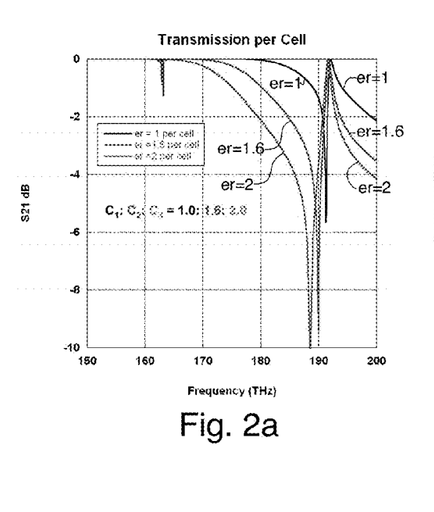
FIGS. 2a and 2b are graphs of dispersion characteristics and optical loss characteristics of a SRR-band optical metamaterial with a period of 400 nm, with gaps and spacing dimensions of 50 nm.
Figure 2B:
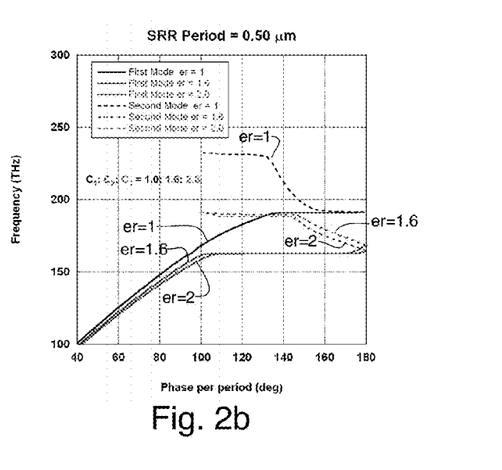
Figure 2C:
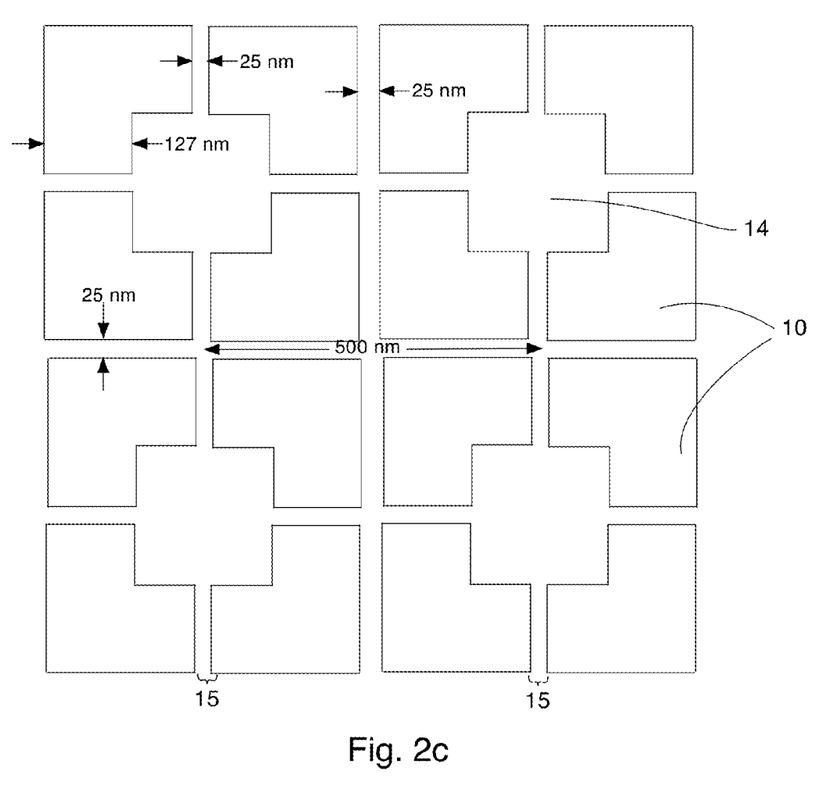
FIG. 2c depicts an embodiment a four-opening square shaped SRR.

FIG. 2a shows the dispersion characteristics of a particular embodiment of a four-opening square shaped SRR 10, simulated using a finite-element method (FEM), with the particular embodiment of a square shaped SRR 10 with four openings 15, each square shaped SSR 10 having a unit cell dimension of 500 nm disposed on a silica substrate 20 ($\in$=2.14) for three different capacitance values with relative values of 1:1.6:2 in the gap (corresponding to $\in_r$=1, 1.6, and 2 in FIG. 2a). The thickness and width of each SRR 10 is 127 nm, and the gap dimensions are 25 nm each for this particular embodiment, which is shown in greater detail in FIG. 2c. The SRRs 10 are assumed to be made of metallic silver in this simulation due to silver's low optical losses, but other materials may be used if desired. The electrical tuning element used in this simulation was simply a dielectric with variable dielectric constant to emulate a variable capacitor. The dielectric constant was varied by 60% and 100% compared to the original value, hence, relative capacitance values of 1.0, 1.6, and 2.0, as shown in the graphs. A widely accepted Drude model was used to emulate the complex dielectric constant of silver in this simulation. FIG. 2a shows the $\omega$-k dispersion characteristics for this metamaterial for the first two propagating modes. As the simulation results indicate, this metamaterial has highly nonlinear dispersion that almost saturates at higher phase delay (wave vector) values, depicting very slow light behavior. There are two possible regions in the dispersion diagram for operation as a very efficient optical phase shifter. The first region is at an optical frequency of about 170 THz using the first propagating mode of the metamaterial. The simulation results indicate that gap capacitance variations in the ratio of 1.6:1 and 2:1 result in effective index changes of 0.10 and 0.13, respectively. Concurrently shown in FIG. 2b is the optical loss of the same metamaterial as a function of frequency of the propagating mode. We note that at the propagating mode frequency of 170 THz, the optical loss is negligible which makes this mode of operation very practical. With an effective index change of 0.1, an optical phase shifter of about 15 µm in length based on this implementation of the tunable metamaterial can provide continuous 0-2$\pi$ phase shift required for a beam steering device.

The second region of operation is at an optical frequency of about 192 THz using the second propagating mode of the metamaterial, as shown with the dotted lines in FIG. 2b. The simulation results indicate an effective index change of 0.46 and 0.61 for gap capacitance variations in the ratio of 1.6:1 and 2:1, respectively. An optical phase shifter of about 2.5 µm in length operating at this frequency can provide continuous 0-2$\pi$ phase shift using the tunable metamaterial design described above. However, this mode has a propagation loss of about 2 dB/µm, which translates into a loss of 5 dB for the 2.5 µm long optical phase shifter. Thus, a trade-off exists between the two propagating modes in terms of the length of the phase shifting device and its optical loss. The second mode has a negative slope in the $\omega$-k diagram, indicating a negative effective index, which can be used for other potential applications. It should be noted here that the above design is just one example of the tunable optical metamaterial proposed here, and by no means the most optimum one. Also, the dispersion characteristics shown in this simulation can be modified for other operating optical frequencies by scaling the dimensions of the SRR structure 10.

In one embodiment, the tuning of the optical metamaterial is obtained by varying the capacitances of $p^+n^+$ tunnel diodes $12_1$ placed in the gaps 15 of the multi-cut SRR structures 10 using applied voltage to the diodes (see the "Tunnel Diode Tuning Element" embodiment of FIG. 1c). In order for these semiconductor-based capacitors (the $p^+n^+$ tunnel diodes $12_1$) to operate at optical frequencies, the plasma frequency of the semiconductor should be higher than the operating frequency. This can be achieved by using heavily doped semiconductors. For example, plasma frequencies of 200-300 THz have been measured for InGaAs layers with doping levels in the range of 2-5×10$^{19}$ cm$^{-3}$. A Si layer with doping levels in the high-10$^{20}$ cm$^{-3}$ will have plasma frequencies in the same range since the effective mass of Si is about 10 times higher than that of InGaAs, and the plasma frequency is proportional to the square-root of the ratio of the doping level to the effective mass of the semiconductor. Si is preferred due to the ability to make CMOS circuits, but III-V material systems may be substituted therefor if desired.

Figure 3:
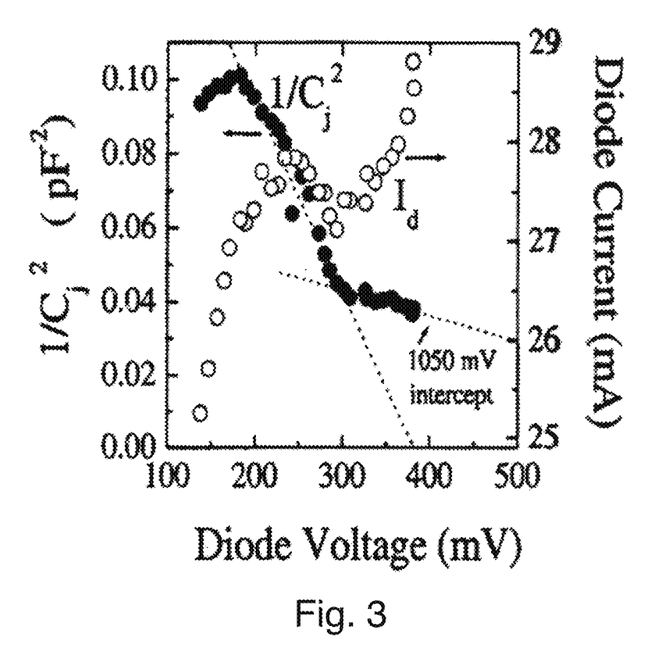
FIG. 3 is a graph of measured junction capacitance-voltage and current-voltage characteristics of a $p^+n^+$ Si tunnel diode as a function of its bias voltage.

FIG. 3 shows the bias voltage dependence of a $p^+n^+$ tunnel diode capacitance in which the p and n regions have doping levels of 7×10$^{20}$ cm$^{-3}$ and 4×10$^{20}$ cm$^{-3}$, respectively. Possible dopants include boron and phosphorous, but other dopants may be used if desired and based on the material system utilized. The measured data indicates that the diode capacitance changes by a factor of about 1.6 for a bias voltage change of less than 200 mV. This capacitance change is used in FIGS. 2a and 2b for the simulation of the dispersion characteristics shift, and hence effective index change, and the optical loss in the example tunable metamaterial described above.

Another electrical tuning element 12 for the metamaterial SRR 10 includes a voltage-controllable sheet conductance in the SRR gaps 15 using high accumulation charge densities (>10$^{13}$ cm$^{-2}$) of MOS structures $12_2$ (see the "MOS Accumulation Charge Layer Tuning Element" embodiment of FIG. 1c). This will result in tuning the effective inductance of the SRR 10, and hence the dispersion of the metamaterial. Yet another electrical tuning element is a nanoelectromechanical (NEMs) capacitor $12_3$ (see the "Nano-electromechanical (NEM) Capacitor" embodiment of FIG. 1c) formed between a movable metallic cantilever 14-1, a bottom metallic pad 14-2, and an air gap 14-3. Application of an appropriate voltage to the NEMs capacitor $12_3$ results in a change in the distance between the movable metallic cantilever 14-1 and the fixed metallic pad 14-2, hence varying its capacitance. One possible technique for routing these various voltages to the SRRs 10 is described below with reference to FIG. 8.

Figure 4:
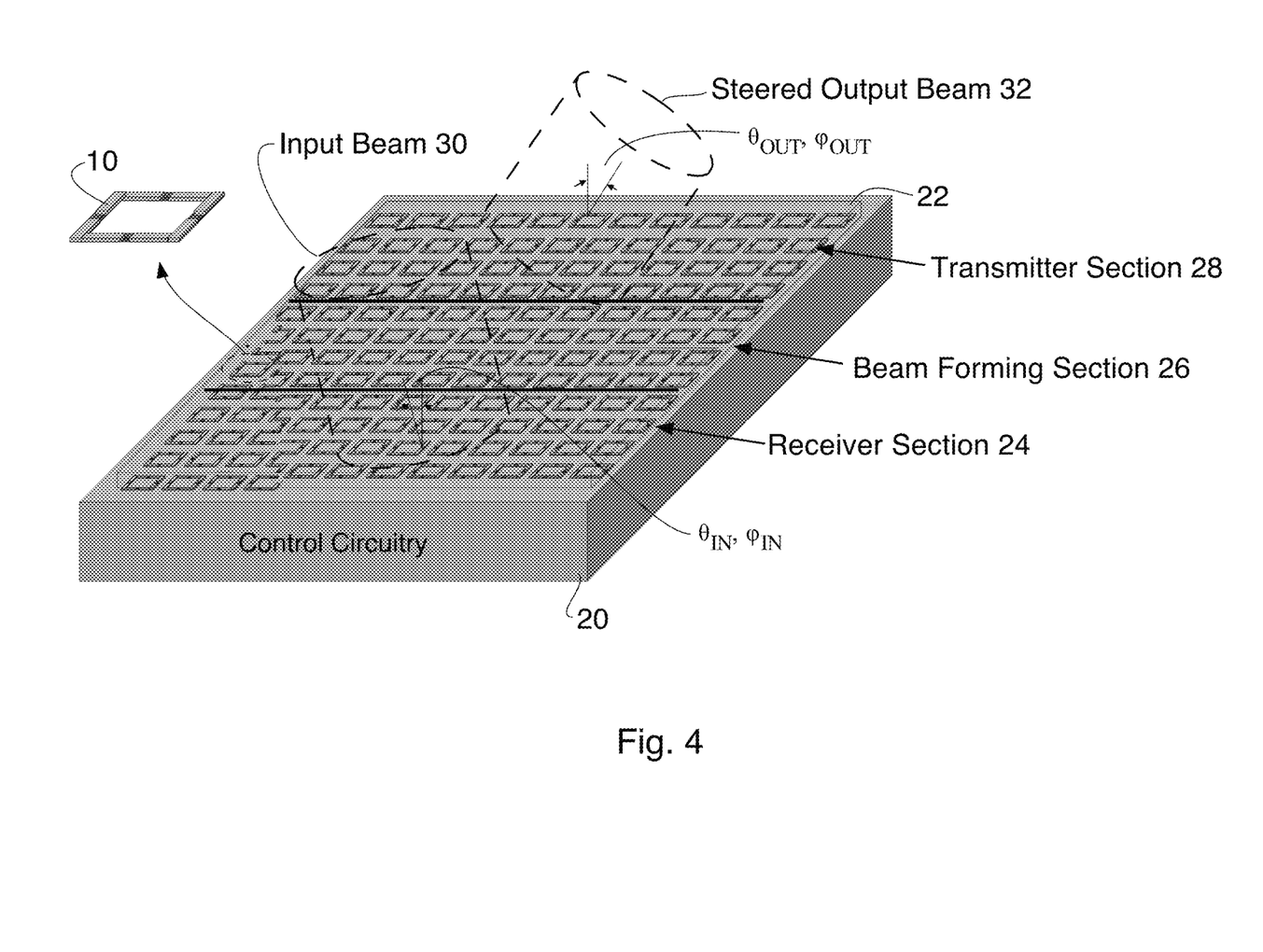
FIG. 4 is a perspective view of a chip-scale optical beam steering device in which the effective optical index of the metamaterial can be programmed for each unit cell to result in the azimuthal and elevational steering of a beam incident on a receiving portion, and propagating along its surface towards a transmitting section in which the beam is out coupled into free space at a desired azimuthal and elevational direction.

One application of the disclosed tunable optical metamaterial is a chip-scale optical beam steering device in which the effective optical index of the metamaterial can be programmed for each unit cell to result in the azimuthal and elevational steering of a beam propagating along its surface, as shown in FIG. 4.

FIG. 4 shows a schematic of a generalized scheme for a free-space optical beam steering and shaping device using the tunable optical metamaterial structure with a 2D array of SRRs 10 described above are disposed on a substrate 20 which preferably includes control circuitry. An Input optical beam is coupled to the metamaterial formed by SRRs 10 as a surface wave using the Receiver Section 24 shown in the FIG. 4. The Receiver Section 24 basically functions as a tunable incoupling grating structure which coherently scatters an incoming free-space optical beam 30 incident at an arbitrary angle ($\theta_{IN}$, $\phi_{IN}$—expressed here in spherical coordinates) into a surface wave that can controllably propagate along the tunable metamaterial surface in the In-Plane Beam Forming Section 26. In the In-Plane Beam Forming Section 26, the in-plane wavefront can be manipulated by appropriately programming the effective index of the SRR elements 10 in the propagation path. Examples of this wavefront manipulations are phase and amplitude modulation, or beam shaping. Finally, the manipulated in-plane wavefront is coherently scattered into free-space at an arbitrary angle ($\theta_{OUT}$, $\phi_{OUT}$—expressed here in spherical coordinates) using the Transmitter Section 28, which, similar to the Receiver Section 24, functions as a tunable outcoupling grating structure. The Receiver Section 24, Beaming Section 26 and Transmitter Section 28 may be all covered, if desired, with a dielectric covering material 22 which is transmissive at the frequencies of interest. The control circuitry under the optical metamaterial, preferably formed using conventional CMOS technology in a Si substrate 20 in this embodiment, provides the tuning functionality to the individual metallic resonant elements of the metamaterial. Based on phased array theory, the steering angle of this device can be expressed as:

$$\sin\theta_0(V) = \frac{\Delta\varphi_i(V)}{2\pi} \frac{\lambda}{d} \quad \text{(Eqn. 1)}$$

where $\theta_0(V)$ is the voltage controllable in-plane steering angle, $\Delta\phi_i(V)$ is the effective voltage dependent phase delay between adjacent elements of the phased array with a spacing d, and $\lambda$ is the wavelength of the steered beam. In order to achieve beam steering approaching end-fire (±90°), a maximum phase delay of $2\pi$ among the array elements (SRRs 10) is required. Using the example metamaterial simulated above (see FIG. 2a) with a unit cell size (array spacing) of 500 nm and a gap spacing between SSRs 10 of approximately 50-75 nm, the effective phase delay at telecom frequencies ($\lambda$=1550 nm is a useful and commonly used telecom frequency) between adjacent SRRs for end-fire steering is $2\pi/3$, with three array elements (SRRs 10) between each $2\pi$ reset. The voltage controllable effective index change of 0.1 simulated for the example optical metamaterial described above with reference to FIGS. 2a-2c, results in a maximum phase delay of $2\pi$ using 30 unit cells in the propagation direction (15 μm long phase shifters). For steering at angles between 0 to 90°, the number of phase shifters (unit cells) between each $2\pi$ reset is varied resulting in the change of the slope of the linear phase change across the array elements. For example, by placing 30 phase shifters between each $2\pi$ reset, a steering angle of about 5° is achieved.

In phased arrays, grating lobes, which are maxima in the radiation patterns of the array besides the main desired lobe, occur at radiated angles $\theta$ given by $\pi d(\sin\theta - \sin\theta_0)/\lambda = \pm n\pi$ (where n is an integer). For the first grating lobe (n=1) to occur at the horizon (in the plane of the dielectric slab shown in FIG. 4), the condition d<$\lambda$ must be satisfied. Since the array spacing (unit cell dimension) of the metamaterial based phased array is a fraction of the wavelength (<$\lambda$/3 in the example above), this approach to optical beam steering will not result in grating lobes, and hence, will be very efficient since output power is not being diverted to undesirable grating lobes.

The number of resolvable steered beam positions in a phased array is given by $M=N\Delta\phi_m/\pi$, where N is the number of array elements and $\Delta\phi_m$ is the maximum available phase delay. For the metamaterial based phased array example give above, one can achieve 60 resolvable steering spots for a 30 element-long array in the propagation direction.

In-plane beam steering is achieved by having uniform effective index for each row of SSR elements 10 in the direction of beam propagation. However, by modulating the effective index for each row of SSR elements 10 in the direction of beam propagation, we can steer the beam out of the plane of the 2-D metamaterial. We can regard this index modulation as an effective tunable optical grating, or alternatively, as a phased array of radiating antennas in the direction of propagation that radiates the beam into free-space. Assuming a maximum phase shift of $2\pi$ between the radiating elements, out-of-plane steering angles between 0 to 90° is achievable, similar to the in-plane steering described above. In-plane steering refers to the steering of the optical beam in the plane of the SRR 10 array and out-of-plane steering refers to the steering of the optical beam out of the plane of the SRR 10 and into free-space.

Besides optical beam steering, the tunable optical metamaterial disclosed herein can have other chip-scale functionalities such as in-plane beam forming and optical modulation. For example, by programming the effective index of the unit cells in a graded fashion, a graded-index (GRIN) lens with tunable focal length can be realized for on-chip shaping of an optical beam. Light can be applied to the surface as described with reference to either FIG. 5 or 8 below.

Figure 5:
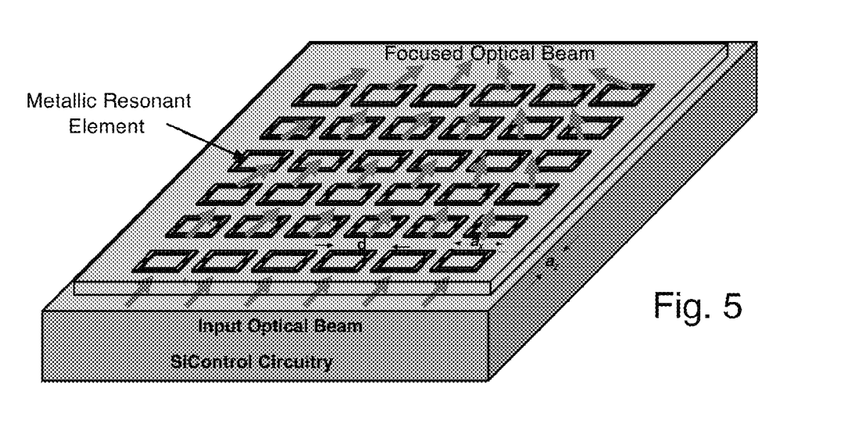
FIG. 5 is a schematic diagram depicting a generalized scheme for an in-plane graded-index (GRIN) lens implemented using the tunable optical metamaterial structure disclosed herein.

FIG. 5 is a schematic diagram depicting a generalized scheme for an in-plane graded-index (GRIN) lens implemented using the tunable optical metamaterial structure disclosed herein. An input optical beam is coupled to the metamaterial as a surface wave as shown in FIG. 5. By programming the effective indices of the individual rows of SRRs 10 according to $$\Delta n(i) = \frac{-f + \sqrt{(ia_X)^2 + f^2}}{N_Z a_Z}$$

where i is the sequence number of the unit cell from the middle to the edges of the array along the x direction, f is the focal distance of the GRIN lens, $a_z$ and $a_x$ are the array spacings in the propagation (z) and perpendicular (x) directions, respectively, and $N_z$ is the number of array elements in the propagation direction.

Another application for the tunable optical metamaterial is small foot-print (<5×10 μm²) Mach-Zender optical modulators with modulation speeds exceeding 10 GHz using the tunable phase shifters described above for the beam steering application modified for a maximum of π-phase shift. Combining this small foot-print optical modulator with the phased array beam steerer results in yet another novel device which can receive a free-space CW optical beam, modulate its amplitude, and radiate it out in a different free-space direction.

Figure 6:
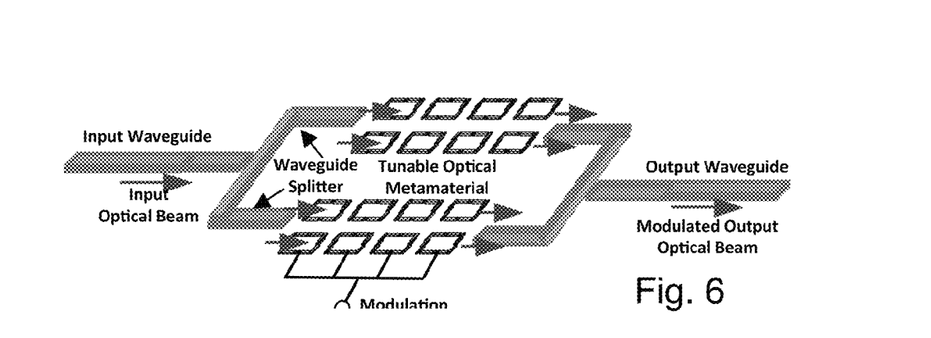
FIG. 6 shows a schematic of the generalized scheme for an in-plane Mach-Zender optical modulator implemented using the tunable optical metamaterial structure.

FIG. 6 shows a schematic of the generalized scheme for an in-plane Mach-Zender optical modulator implemented using the tunable optical metamaterial structure. An input optical beam is coupled to the optical metamaterial via, for example, an optical waveguide. By uniformly changing the effective index of the tunable optical metamaterial, the propagating optical mode experiences an optical phase change, whose magnitude depends on the effective index change and the propagation length across the metamaterial. The phase modulated optical beam is then coupled to an output waveguide, hence forming an optical phase modulator. By implementing the tunable optical metamaterial in a Mach-Zender configuration, for example, an optical amplitude modulator is realized (shown in FIG. 6).

Figure 7:
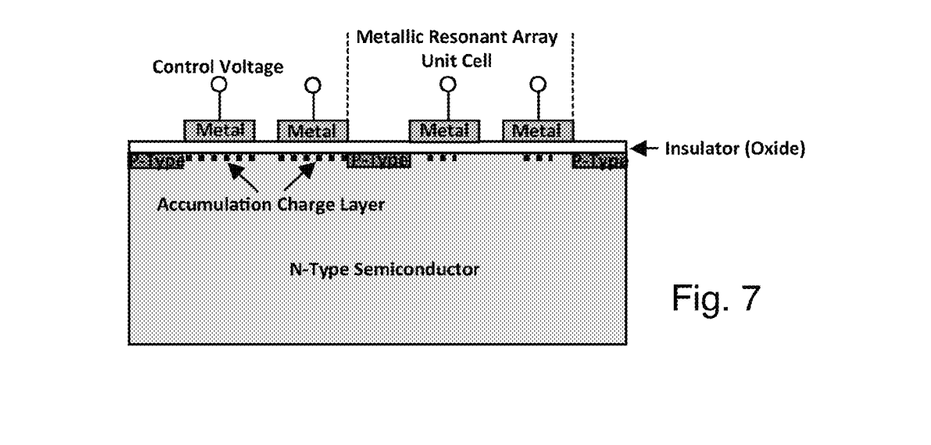
FIG. 7 shows a schematic of a generalized scheme for tuning the optical metamaterial based on an array of metallic resonant elements using the modulation of induced surface charge layers at the interface of the metal-insulator-semiconductor (MIS) or metal-oxide-semiconductor (MOS) structure formed below the resonant array.

FIG. 7 shows the schematic of the generalized scheme for tuning the optical metamaterial based on an array of metallic resonant elements using the modulation of induced surface charge layers at the interface of the metal-insulator-semiconductor (MIS) or metal-oxide-semiconductor (MOS) structure formed below the resonant array. The charge layers induced under each metallic segment of the array have preferably the same polarity as the semiconductor material—resulting accumulation charge layers are faster to switch in to and out of the interface compared to inversion charge layers which would be formed when the polarities of the charge layer and the semiconductor are of the opposite type. The magnitude of the accumulation layers induced under each metal segment of the array is controlled via the application of a corresponding voltage on the metal layer of the MIS structure, as shown in the Figure. Semiconductor regions with opposite polarity to that of the substrate are formed in the space between neighboring array elements (P-type regions shown in the Figure) in order to prevent the diffusion of the induced accumulation layer charge between the elements. The accumulation charge density induced under the metallic segments within each unit cell will diffuse laterally and result in a change in the effective inductance of the array element. This, in turn, results in the local tuning of the resonant frequency of the array, and hence its dispersion characteristics and effective index profile.

Figures 8, 8A:
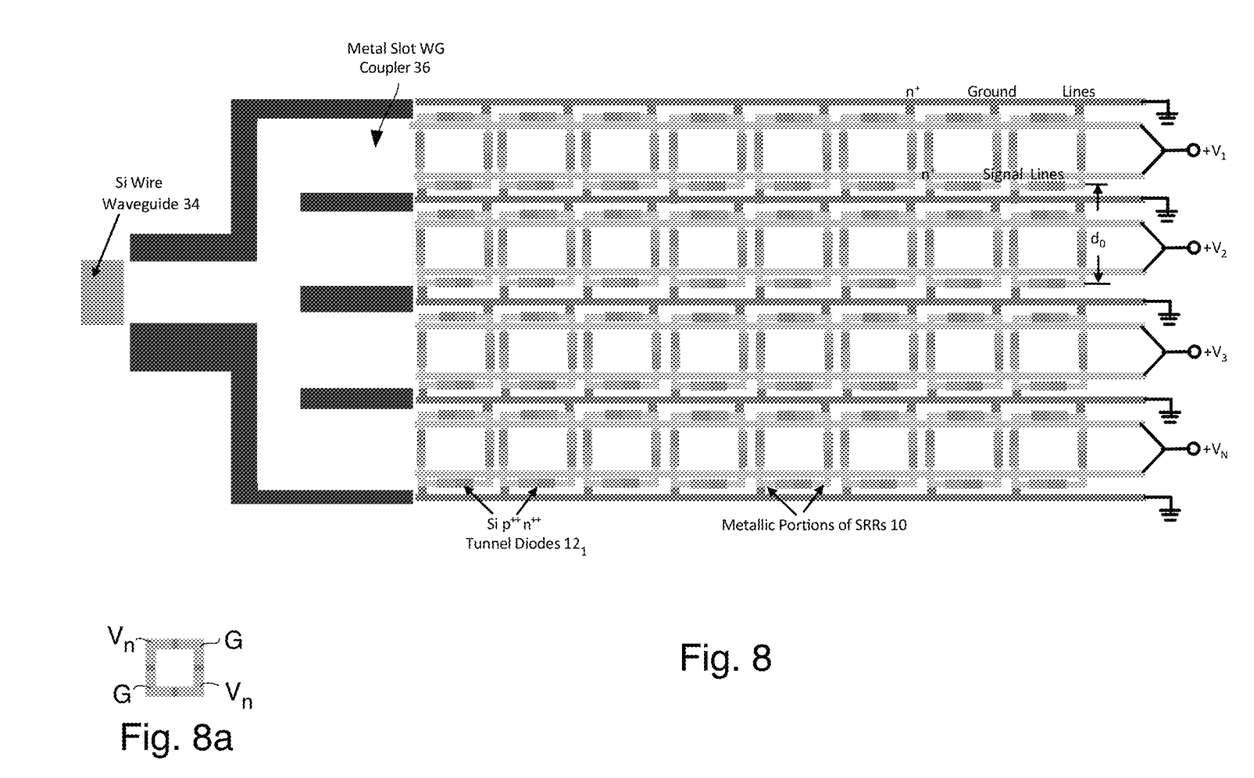
FIGS. 8 and 8a depicts one embodiment of how bias lines can be routed to the split ring resonator (SRR) array.
Figure 9:
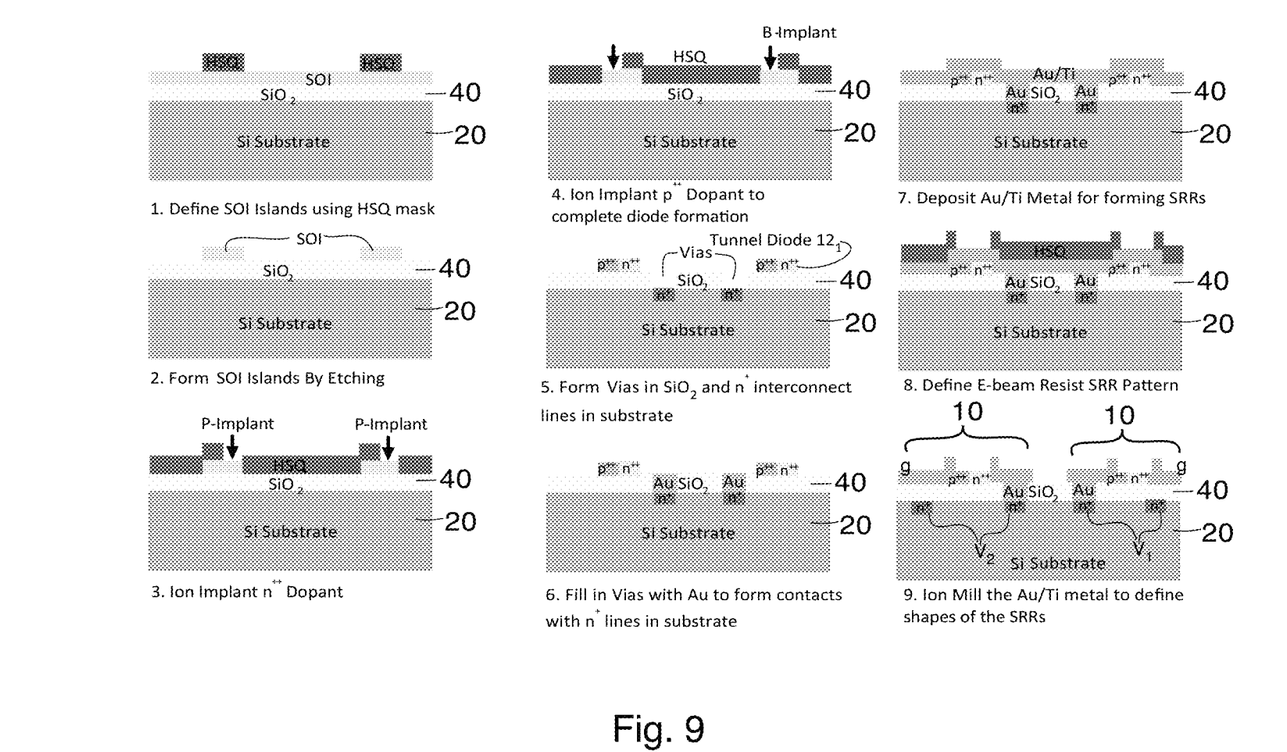
FIG. 9 shows a cross-section of one element in the array during different fabrication steps which may be used to form an array of SRRs 10 and their buried bias lines.
Figure 10A:
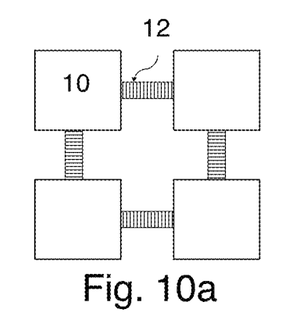
FIGS. 10a-10f depict embodiments where the metallic resonant structures are implemented as solid metallic patches sized to be resonant at optical frequencies.
Figure 10B:
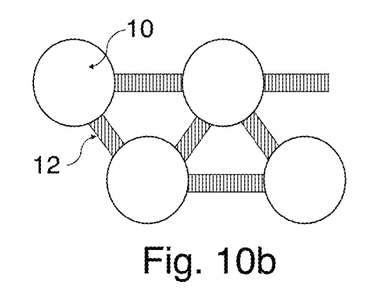
Figure 10C:
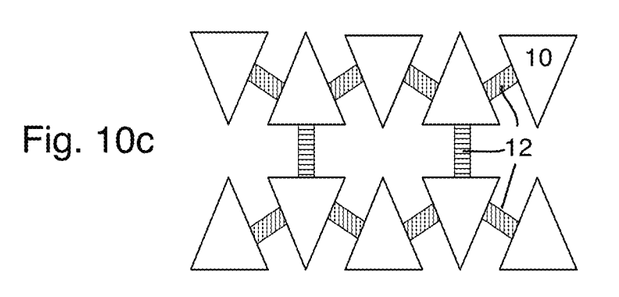
Figure 10D:
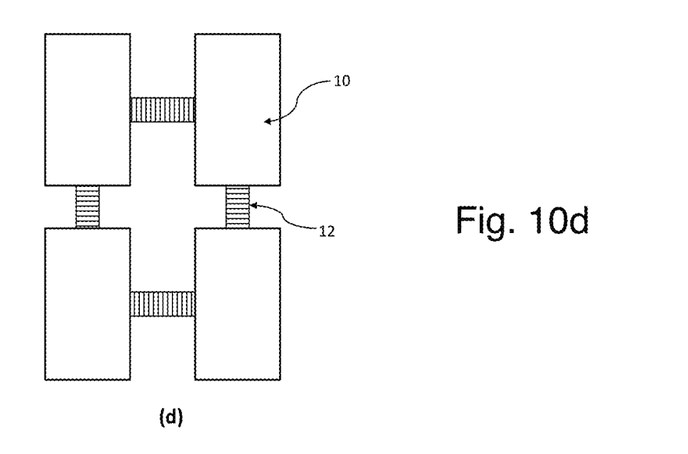
Figure 10E:
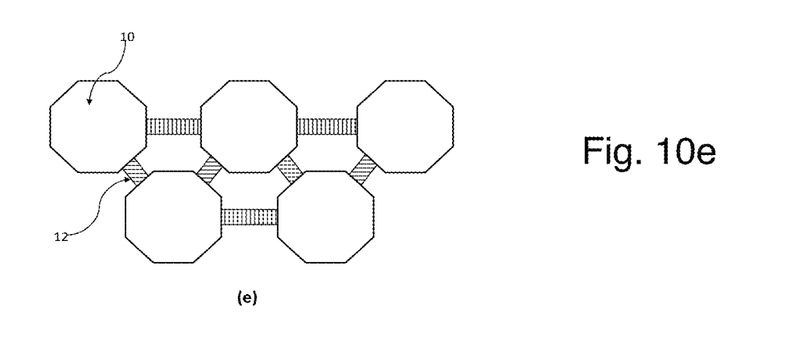
Figure 10F:
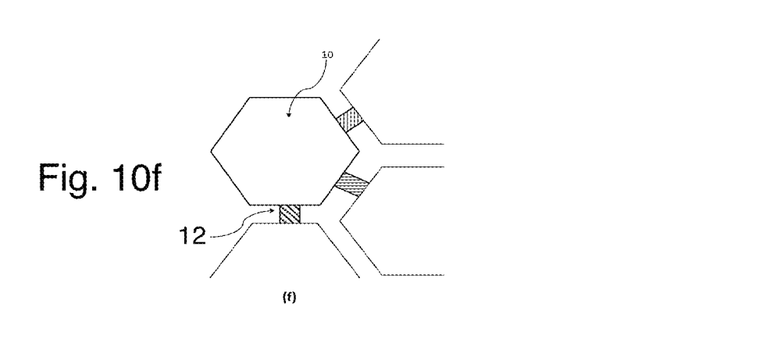

FIG. 8 depicts one embodiment of how the bias lines may be routed to the SRR 10 array. As this top view figure indicates, there are two sets of bias lines that run horizontally across the SRR array—the first set is connected to the drive signals $V_1 \ldots V_N$ (which can be DC or AC), and the second set is connected to ground. These bias lines connect to the metallic portions of the SRRs 10, as shown. A tuning element (preferably a tunnel diode $12_1$) is placed in each of the four openings 12 (see FIG. 1b for example) of the SRRs 10. The tuning elements 12 can be a nano-scale varactor (such as a n++p++ tunnel diode $12_1$), a device $12_2$ utilizing the voltage dependent conductance of MIS accumulation layers or a NEMs variable capacitor $12_3$. The two sets of bias lines are alternately connected to the two terminals of the tuning elements $12_1$ as shown. If tuning elements $12_2$ are used instead, then additional bias lines may be utilized. In the preferred embodiment, the bias lines are heavily doped n+ strips (formed preferably by ion implantation) that are either buried (see the lines for drive signals $V_1 \ldots V_N$) or otherwise spaced from the SRRs 10 (see the ground lines) in the underlying Si substrate 20 of the silicon-on-insulator (SOI) structure on top of which the SRRs 10 are formed. FIG. 9 shows a the cross-section of one element in the array during fabrication steps 1-9 involved to form an array of SRRs 10 and their buried bias lines, for more clarity of understanding.

In FIG. 9, silicon and silicon dioxide are used for substrate 20 and insulating layer 40 respectively. Of course other semiconductor materials may be substituted for the silicon and other insulating materials may be substituted for (or used in addition to) silicon dioxide. Likewise other electrical conductors may be used in lieu of or in addition to those described above and in the drawings.

As shown in FIG. 8a, each SRR 10 in FIG. 8 has its four metallic elements either connected to either ground (G) or to one of the bias lines $V_1 \ldots V_N$ (generically indicated by $V_n$ in FIG. 8a).

Also shown in FIG. 8 is an embodiment of how an input light is coupled to the array of SRRs 10 through an input Si waveguide 34, which in turn is coupled to a metal slot waveguide coupler 36. The direction of light propagation is from left to right in FIG. 8. Once the light reaches the end of the SRR array, it is in-plane steered in the direction perpendicular to the propagation direction. For out-coupling into free-space, a second tunable SRR array can be placed following this array, which functions as a variable out-coupling grating structure for steering in the vertical (out-of-plane) direction.

This embodiment of the optical metamaterial tuning array can be realized by first forming regions of opposite polarity to the semiconductor substrate 20 material in the space between the array elements 10, preferably, by ion implantation. Alternately, these regions can be formed by first depositing a semiconductor layer with opposite polarity on top of the substrate, and then etching it away every where except in these regions. Next, the insulator or oxide layer of the MIS (MOS) structure is deposited, followed by the deposition and patterning the metallic structure of the array by etching or a lift-off process.

FIGS. 10a through 10f show embodiments where the metallic structures 10 are solid metallic patches without the openings shown in FIG. 1a for example. In these embodiments the patches are sized to be resonant at optical frequencies and the capacitive elements 12 connected between neighboring patches 10 are implemented as semiconductor devices (such as the tunnel diodes or MOS devices shown in FIG. 1c).

Having described this invention in connection with a preferred embodiment thereof, further modification will now suggest itself to those skilled in the art. The invention is therefore not to be limited to the disclosed embodiments except as specifically required by the appended claims.

The invention claimed is:

1. An optical beam steering device using tunable optical metamaterial in which a free-space optical beam is coupled into one portion of a plane of the optical metamaterial and subsequently steered out in controllable azimuthal and elevational directions from a different portion of said plane of optical metamaterial, the optical metamaterial including a two dimensional array of resonant annular ring elements, each of the resonant annular ring elements having a plurality of openings therein; and a plurality of voltage controllable electrical tuning elements disposed in or adjacent the openings in each of the resonant annular ring elements, each of the voltage controllable electrical tuning elements ohmically contacting spaced apart portions of only one of said ring elements.

2. The optical beam steering device of claim 1 wherein each of the voltage controllable electrical tuning elements comprises highly doped semiconductor tunnel diode, or the charge accumulation layer at a semiconductor/insulator interface of a metal-insulator-semiconductor structure.

3. The optical beam steering device of claim 1 wherein each of the resonant annular ring elements has a square, annular shape with four sides, each side having an opening therein for accommodating at least one of said voltage controllable electrical tuning elements.

4. The optical beam steering device of claim 3 wherein the each of the resonant annular ring elements is formed of a metallic material.

5. The optical beam steering device of claim 1 wherein each of the resonant annular ring elements has a round, annular shape of four portions, each portion being separated from an adjacent portion by an opening for accommodating at least one of said voltage controllable electrical tuning elements.

6. The optical beam steering device of claim 5 wherein the each of the resonant annular ring elements is formed of a metallic material.

7. An optical beam steering device comprising:
a two dimensional array of resonant annular ring elements, each resonant annular ring element having a plurality of openings therein; and
a plurality of voltage controllable electrical tuning elements disposed in or adjacent the openings in each of said ring elements, each of said voltage controllable electrical tuning element ohmically contacting portions of only one of said ring elements.

8. A tunable optical metamaterial comprising a two dimensional array of resonant metallic annular elements with at least four voltage controllable electrical tuning elements disposed within spaced-apart openings in annular walls of each element, each resonant metallic element in said array being resonant at optical frequencies, and voltage controllable electrical tuning elements comprising highly doped semiconductor tunnel diodes, or devices utilizing channel conductance of the charge accumulation layer at a semiconductor/insulator interface of a metal-insulator-semiconductor structure, or nanoelectromechanical capacitors.

9. A tunable optical metamaterial including an array of resonant metallic elements which are resonant to electromagnetic radiation having a wavelength longer than 0.4 microns and shorter than 0.3 mm, each of the resonant metallic elements in said array comprising a split ring having a plurality of openings in the split ring and having at least one voltage controllable electrical tuning elements disposed in each opening in the split ring and wherein each resonant metallic element has a square, annular shape with four sides, each side having an opening therein for accommodating one of said voltage controllable electrical tuning elements.

10. An optical beam steering device comprising the tunable optical metamaterial of claim 9 in which a free-space optical beam is coupled into a receiving portion of a plane of the optical metamaterial of claim 9 and is steered out of a transmitter portion of the plane of the optical metamaterial of claim 9 in controllable azimuthal and elevational directions.

11. The tunable optical metamaterial of claim 9 wherein the voltage controllable electrical tuning elements comprise highly doped semiconductor tunnel diodes, or the charge accumulation layer at a semiconductor/insulator interface of a metal-insulator-semiconductor structure.

12. A tunable optical metamaterial including an array of resonant metallic elements which are resonant to electromagnetic radiation having a wavelength longer than 0.4 microns and shorter than 0.3 mm, each of the resonant metallic elements in said array comprising a split ring having a plurality of openings in the split ring and having at least one voltage controllable electrical tuning elements disposed in each opening in the split ring and wherein each resonant metallic element has a round, annular shape with four metallic portions, each metallic portion being separated from an adjacent metallic portion by an opening for accommodating one of said voltage controllable electrical tuning elements.

13. A tunable optical metamaterial including an array of resonant metallic elements which are resonant to electromagnetic radiation, each of the resonant metallic elements in said array assuming an annular round shape having a exterior wall with a plurality of openings in said exterior wall and having one or more voltage controllable electrical tuning elements disposed within the openings in said exterior wall.

14. The tunable optical metamaterial of claim 13 wherein the exterior wall has four openings in said exterior wall for receiving said voltage controllable electrical tuning elements.

15. The tunable optical metamaterial of claim 13 wherein the voltage controllable electrical tuning elements comprise highly doped semiconductor tunnel diodes, or devices utilizing channel conductance of the charge accumulation layer at a semiconductor/insulator interface of a metal-insulator-semiconductor structure, or nanoelectromechanical capacitors.

16. The tunable optical metamaterial of claim 13 wherein the array of resonant metallic elements comprises a two dimensional array of resonant metallic elements.

* * * * *